United States Patent
Chen et al.

(10) Patent No.: US 8,698,199 B2
(45) Date of Patent: Apr. 15, 2014

(54) FINFET STRUCTURE

(75) Inventors: Tong-Yu Chen, Hsinchu (TW); Chih-Jung Wang, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 13/347,707

(22) Filed: Jan. 11, 2012

(65) Prior Publication Data

US 2013/0175621 A1    Jul. 11, 2013

(51) Int. Cl.
*H01L 29/78* (2006.01)

(52) U.S. Cl.
USPC ............ 257/192; 257/E21.409; 257/E29.255; 257/E27.06

(58) Field of Classification Search
USPC ............. 257/E21.409, E29.255, E27.06, 288, 257/E21.19, 347, E21.09, E27.112, 192, 257/369, 401, E29.242, E21.24, E21.546
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,388,259 B2 | 6/2008 | Doris | |
| 7,470,570 B2 | 12/2008 | Beintner | |
| 7,531,437 B2 | 5/2009 | Brask | |
| 7,569,857 B2 | 8/2009 | Simon | |
| 7,714,397 B2 | 5/2010 | Hareland | |
| 7,843,000 B2 | 11/2010 | Yu | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0111199 A1* | 5/2008 | Kim et al. | 257/401 |
| 2008/0157208 A1 | 7/2008 | Fischer | |
| 2009/0078997 A1* | 3/2009 | Greene et al. | 257/347 |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2011/0049629 A1* | 3/2011 | Ishikawa et al. | 257/350 |
| 2011/0175161 A1 | 7/2011 | Chen | |

* cited by examiner

*Primary Examiner* — Zandra Smith
*Assistant Examiner* — Paul Patton
(74) *Attorney, Agent, or Firm* — Winston Hsu; Scott Margo

(57) ABSTRACT

A finFET device includes a substrate, at least a first fin structure disposed on the substrate, a L-shaped insulator surrounding the first fin structure and exposing, at least partially, the sidewalls of the first fin structure, wherein the height of the L-shaped insulator is inferior to the height of the first fin structure in order to expose parts of the sidewalls surface of the first fin structure, and a gate structure disposed partially on the L-shaped insulator and partially on the first fin structure.

10 Claims, 6 Drawing Sheets

FINFET STRUCTURE

BACKGROUND OF THE INVENTION

1. Field of the Invention

The present invention relates to a finFET structure and a manufacturing method thereof, more particularly to a finFET structure with an L-shaped insulator and a manufacturing method thereof.

2. Description of the Prior Art

One of the purposes of the development of the semiconductor industry is to enhance the efficiency and reduce the energy consumption of the semiconductor devices. When it comes to enhancing the efficiency of the semiconductor devices, it is known from the prior art, that different lattice structures may facilitate the mobility of the electrons or the holes.

For example, higher carrier mobility can be observed when a metal-oxide-semiconductor (MOS) is constructed on an n-channel of a silicon lattice (100), and similarly higher carrier mobility can be observed when a metal-oxide-semiconductor (MOS) is constructed on a P-channel of a silicon lattice (110). As a result, when a planar complementary MOS is constructed, the silicon of different lattices is formed at the same to build a substrate, so that the MOS of the n-channel is constructed on the lattice (100), and the MOS of the P-channel is constructed on the lattice (110) to obtain better performances.

Besides, as the critical dimension of the devices shrinks, in particular for the dimensions below 65 nm, non-planar devices like fin field effect transistor (FinFET) are seen as a replacement for the planar complementary MOS, since it is getting more and more difficult to reduce the physical dimensions of the conventional planar complementary MOS.

However, it is not easy to control the channel width of the non-planar CMOS, and enhance the carrier mobility of the device at the same time. Given the above, a finFET structure and a method for forming a finFET structure are still needed to overcome these problems.

SUMMARY OF THE INVENTION

According to a preferred embodiment of the present invention, a finFET device includes a substrate, at least a first fin structure disposed on the substrate, a L-shaped insulator surrounding the first fin structure and exposing at least partially the sidewalls of the first fin structure, wherein the height of the L-shaped insulator is inferior to the height of the first fin structure, in order to expose parts of the sidewalls surface of the first fin structure, and a gate structure disposed partially on the L-shaped insulator and partially on the first fin structure.

According to another preferred embodiment of the present invention, a manufacturing method of a finFET device includes the following steps. First, at least a first fin structure is formed on a substrate; an L-shaped insulator is then formed on the sidewalls of the first fin structure, wherein the height of the L-shaped insulator is inferior to the height of the first fin structure in order to expose parts of the sidewalls surface of the first fin structure. A gate structure is then disposed partially on the L-shaped insulator and partially on the first fin structure, and finally a source/drain structure is formed in the first fin structure at both sides of the gate structure.

In the present invention, an L-shaped insulator is disposed on the STI to adjust the channel width of the finFET. In addition, a plurality of finFETs with different channel widths can be formed on one substrate. Furthermore, the present invention could provide more stress to the fin structure and enhance the carrier mobility of the finFET.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
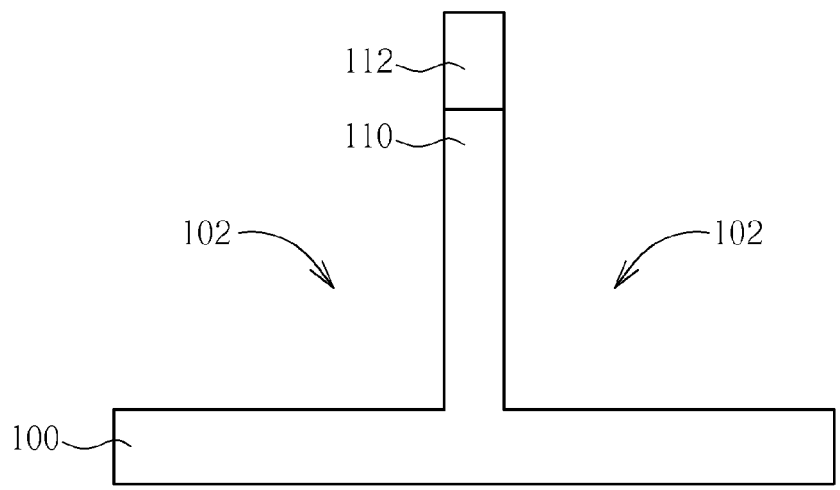
FIGS. 1-9 are schematic diagrams illustrating a manufacturing method of the finFET according to the first preferred embodiment of the present invention.

Please refer to FIGS. 1-9. FIGS. 1-9 are schematic diagrams illustrating a manufacturing method of the FinFET according to the first preferred embodiment of the present invention. The manufacturing method of the semiconductor device in this embodiment includes the following steps: first, as shown in FIG. 1, a substrate 100 is provided, such as silicon substrate, epitaxial silicon substrate, silicon germanium substrate, silicon carbide substrate or silicon-on insulator substrate (SOI). The first preferred embodiment of the present invention uses bulk silicon as substrate, but is not limited to. A cap layer 112 is formed on the substrate 100, and a buffer layer (not shown) maybe formed between the substrate 100 and the cap layer 112. In one embodiment of the present invention, the material of the cap layer 112 can comprise silicon nitride (SiN) or APF (advanced pattern film, provided by Applied Materials), and the material of the buffer layer could be silicon oxide (SiO2) etc. The cap layer 112 is at least partially removed through a photo-etch process as well as parts of the substrate 100 so as to form a fin structure 110 and a plurality of trenches 102 on the substrate.

Figure 2:
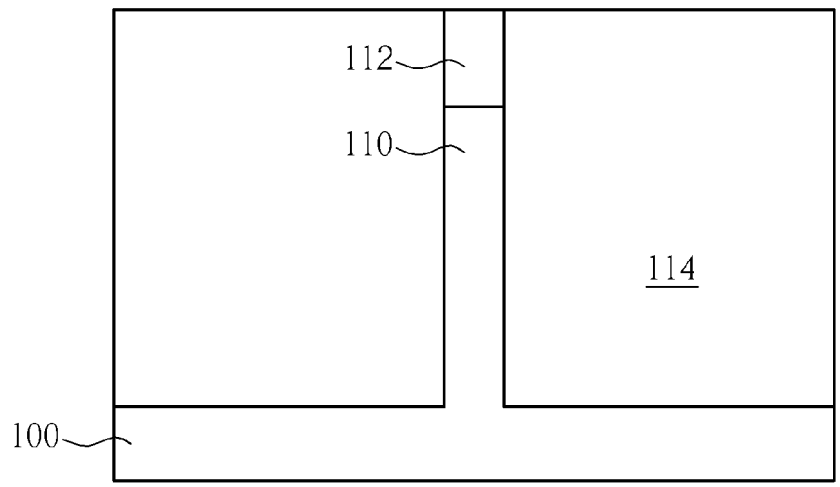
Figure 3:
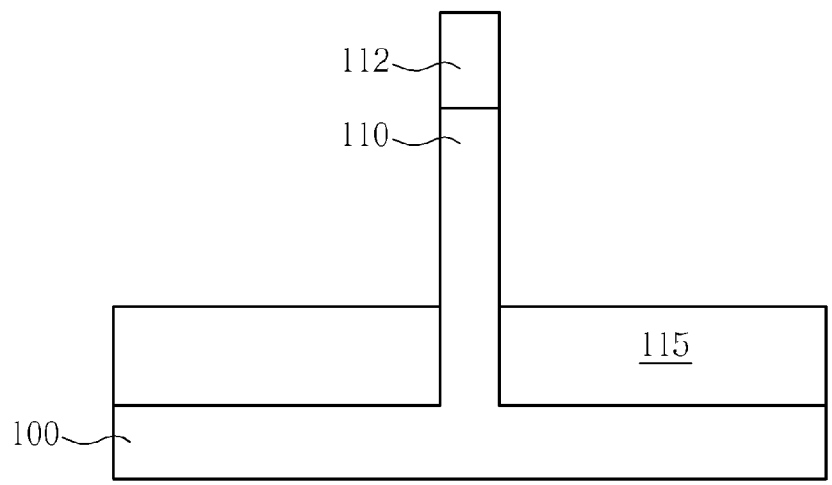

As shown in FIG. 2, a dielectric layer 114 is formed on the substrate 100, the cap layer 112 and in each trench 102. A planarization process, such as a chemical mechanical polishing (CMP) process, is then performed on the dielectric layer 114, using the cap layer as the stop layer in order to expose the top surface of the cap layer 112. The dielectric layer 114 may be a single or a multi-materials layer, comprising shallow trench isolation (STI) material. The procedures are well known to persons of ordinary skills in the art and the details will not be described here. As shown in FIG. 3, the dielectric layer 114 is then partially removed by an etching process to form shallow trench isolations (STI) 115 in each trench 102, as insulation between each of the fin structures. The etching may be carried out through a dry etching process, such as $CF_4 + O_2$ and Ar, or a wet etching process, such as dilute HF. In addition, in another embodiment, the dielectric layer 114 may be removed by an etching process to form the STI 115 directly, with no planarization process performed onto.

Figure 4:
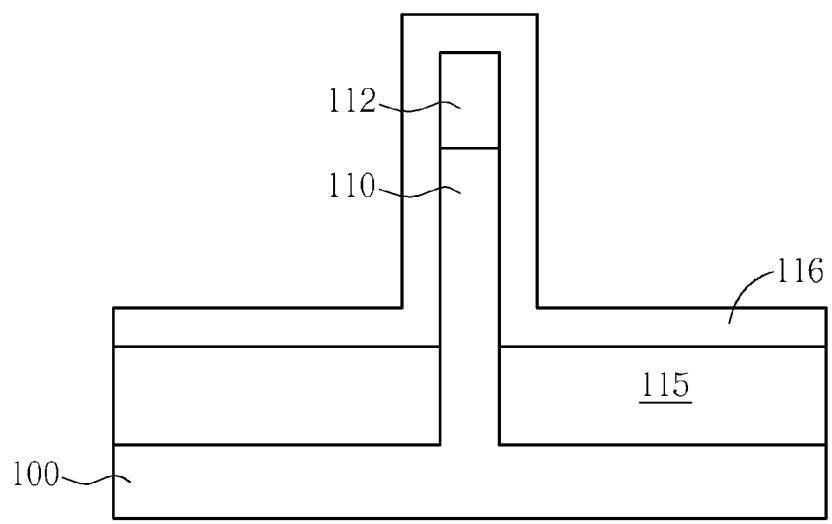

As shown in FIG. 4, a first stressor 116 is formed on the STI 115, the cap layer 112 and the sidewalls of the fin structure 110. In one preferred embodiment of the present invention, the first stressor may be formed by single or multiple materials which provide stress, such as silicon nitride or silicon oxide. Depending on the finFET being P-type or N-type, the stressor will provide compressive or tensional stress on the fin structure 110. In addition, in this embodiment, a RTA (Rapid Thermal Annealing) process may be performed to transfer stress to the fin structure.

Figure 5:
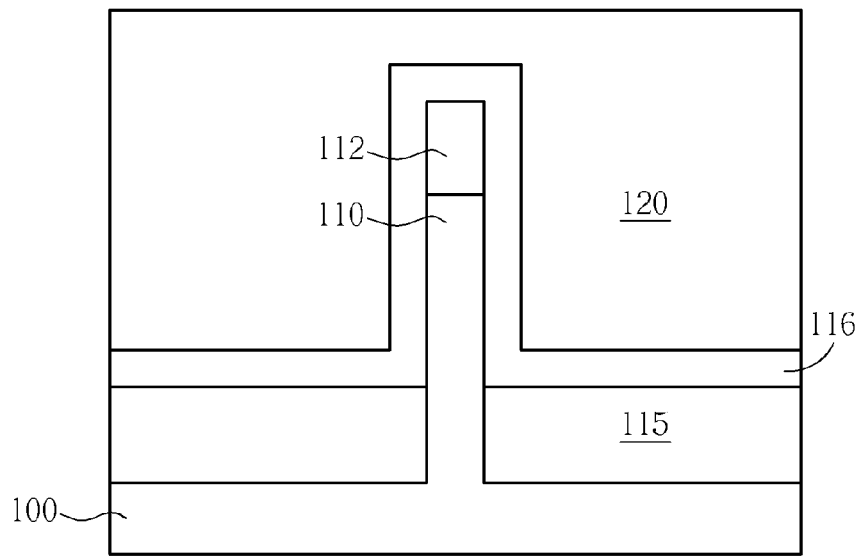
Figure 6:
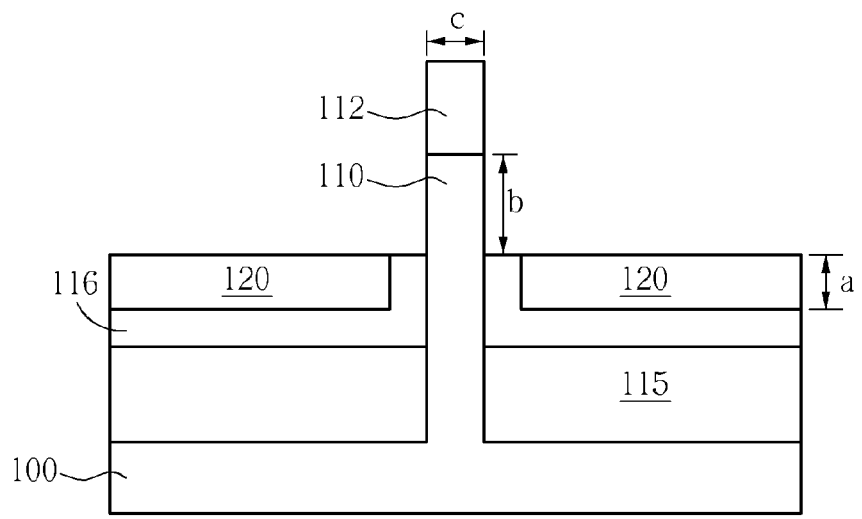

In order to control the channel width of the finFET and provide stress continually to the finFET, parts of the first stressor 116 are removed to form an L-shaped insulator. In this step, as shown in FIG. 5, a gate tuning material 120 is formed on the first stressor 116, the material of the gate tuning material 120 could be selected from the group of SiO2, SiN and spin coating application compatible materials such as photoresist and BARC5, etc, but has to be different from the material of the first stressor 116, so that they have different etching rates with respective to an etching recipe: there has to be an etching selectivity for the first stressor 116 and the gate tuning material 120. This way, the thickness of the material could be adjusted during the process. Furthermore, as shown in FIG. 6, the gate tuning material is partially removed by an etching process, with a remaining thickness of the gate tuning material (labeled "a" on FIG. 6), which exposes the first stressor 116 covering the fin structure 110. Then the stressor 116 is partially removed to form an L-shaped insulator 122 that surrounds the fin structure 110.

It is worth noting that the thickness "a" of the gate tuning material can be controlled by adjusting the process parameters, the length "b" of the fin structure exposed part is determined by the thickness "a" and the width of the fin structure is labeled "c". In a tri-gate finFET structure (the tri-gate is the gate that covers an upper surface and both of two side surfaces of the fin structure), the effective channel width of the finFET is therefore 2b+c; in other words, by adjusting the length of b, the inventor can control the channel of the finFET, and therefore enhance the carrier mobility of the finFET by providing tensional or compressive stress to the channel.

Figure 7:
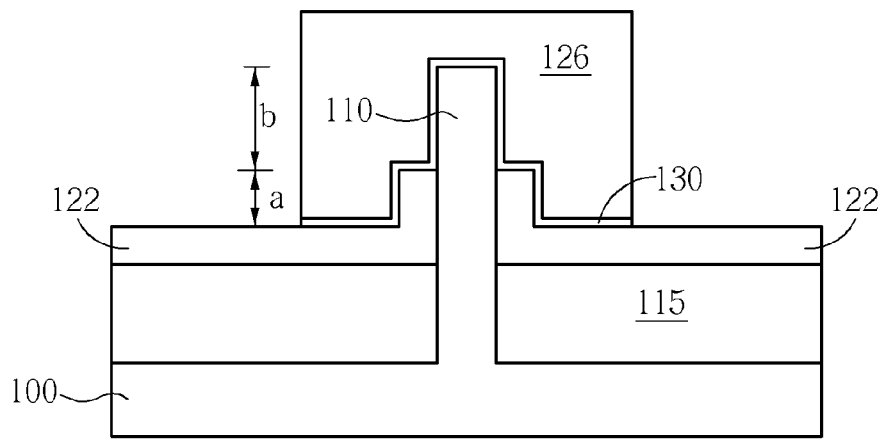

As shown in FIG. 7, the remaining gate tuning material 120 and cap layer 112 are removed, the L-shaped insulator is on the STI 115 and surrounds the fin structure 110 on both sides of the STI 115, and the length of the L-shaped insulator 122 covering the sidewalls of the fin structure is "a", the length of the exposed fin structure is "b". The L-shaped insulator 122 comprises two parts: a horizontal part and a vertical part, which height over the horizontal part is "a", with "a" inferior to the height of the fin structure; the height of the exposed part of the fin structure is "b".

A gate 126 is formed on the fin structure 110 and the L-shaped insulator 122, and a doped region such as source/drain (not shown) is formed in the both sides of the fin structure. Moreover, the material of the gate 126 can be selected from the group: polysilicon, silicide or metal such as aluminum (Al), tungsten (W), copper (Cu), titanium aluminide (TiAl), titanium (Ti), titanium nitride, (TiN), tantalum (Ta), Tantalum nitride (TaN), titanium aluminum oxide (TiAlO) etc.

Figure 8:
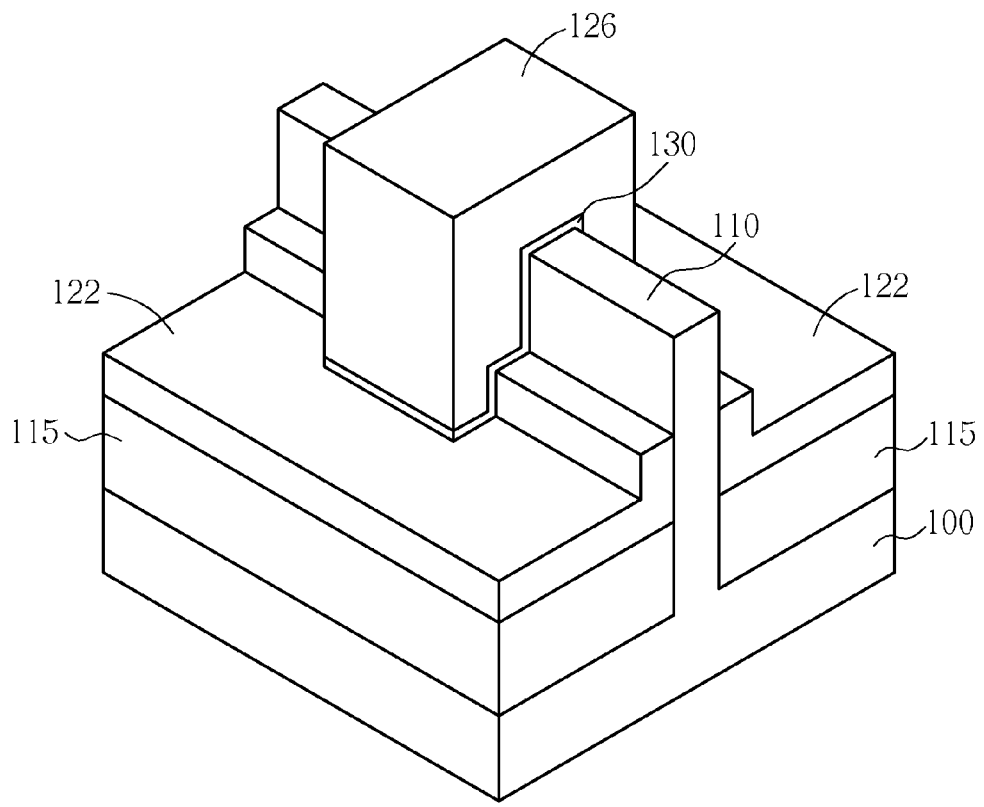

The present invention may be implemented with a gate first process or a gate last process. For example, during the gate first process, a dielectric layer 130 or a high-k dielectric layer or a combination thereof is placed on the substrate 100, the fin structure 110 and the L-shaped insulator 122. Then, a conductive layer made of polysilicon or metal or a combination thereof is formed on the dielectric layer, and a gate 126 is then formed by a photo-etching process. The 3D-diagram of the finFET is shown in FIG. 8. The material of the dielectric layer 130 or the high-k dielectric layer can be selected from the group of hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). Furthermore, agate replacement process may be performed on the polysilicon gate during a gate last process of the present invention.

Figure 9:
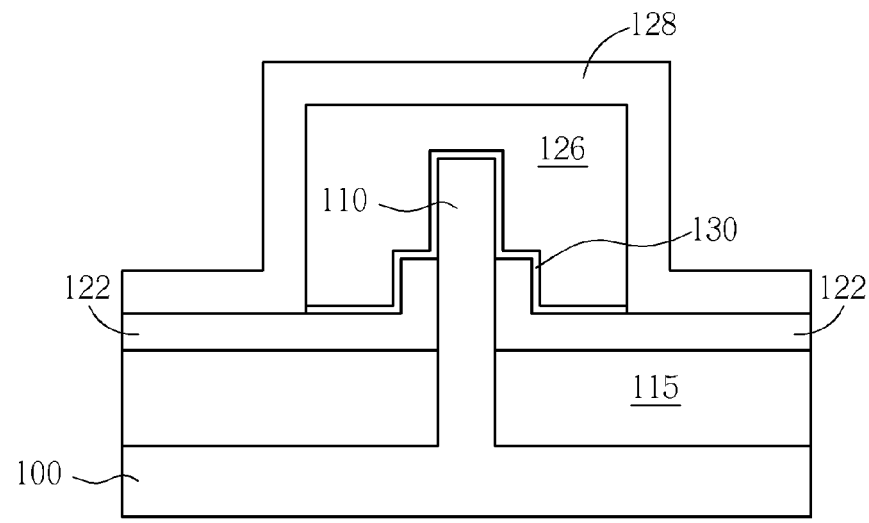

Finally, as shown in FIG. 9, a second stressor 128 is formed on the surface of the L-shaped insulator 122, the fin structure 110 and the gate 126. The stressor 128 provides another stress to the channel length of the finFET. In other words, the channel length of the finFET can be compressed or tensioned using the stressor 128, and can be adjusted this way, so that the carrier mobility of the finFET can be greatly enhanced. The second stressor 128 may be a conformal layer accompanied with an inter layer dielectric (ILD) in a later process, or the second stressor 128 may be a non-conformal layer for replacing the ILD.

Figure 10:
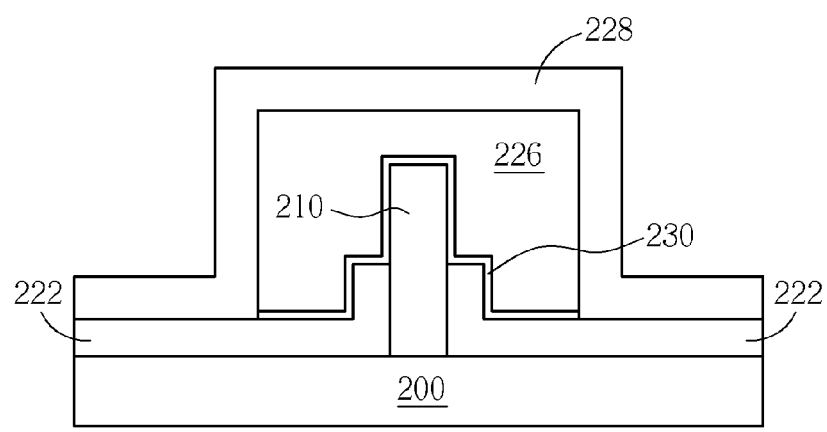
FIG. 10 is a schematic diagram illustrating a structure of the finFET according to the second preferred embodiment of the present invention.

It is worth noting that in another embodiment of the present invention, a SOI substrate may be used as the substrate, and a fin structure is formed on the SOI substrate directly, so that the STI manufacturing process would be simplified. For example, as shown in FIG. 10, at least one fin structure is formed on the insulator layer 200 of the substrate, and other manufacturing processes are similar to those of the first preferred embodiment, for sequentially forming an L-shaped insulator layer 222, a dielectric layer 230, a gate 226 and a second stressor 228 on the insulator layer 222.

Figure 11:
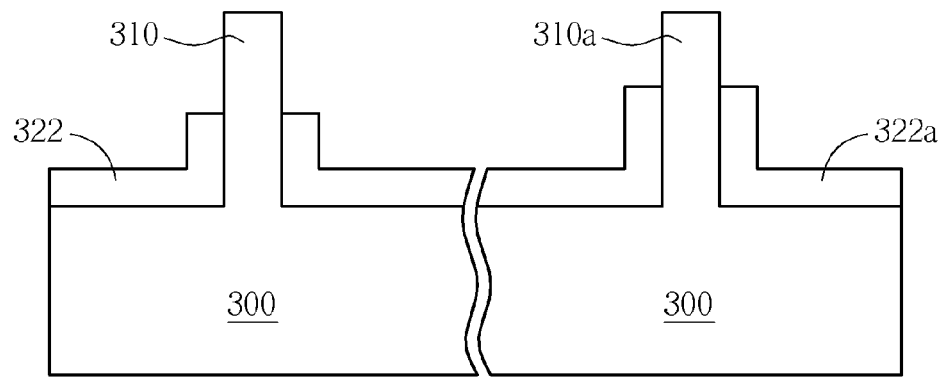
FIG. 11 is a schematic diagram illustrating a structure of the finFET according to the third preferred embodiment of the present invention.

Even though the preferred embodiment mentioned above describes only one fin structure on the substrate, it is not limited thereto. In other words, the invention may comprise a plurality of fin structures on the substrate, wherein each height of the fin structures covered by the L-shaped insulators is different, so that the invention has different applications, such as high-voltage MOS, low voltage MOS, logic and memory transistor device. As shown in FIG. 11, the fin structure 310 and a second structure 310a are on the substrate 300. The fin structure 310 is surrounded by the L-shaped insulator 322, and the second fin structure 310a is surrounded by a second L-shape insulator 322a, the height of the vertical part of the L-shaped insulator 322 and the second L-shaped insulator 322a may be different. Then a plurality of gates and second stressors are formed. This way, a plurality of finFETs with different channel widths may be formed on one substrate.

Figure 12:
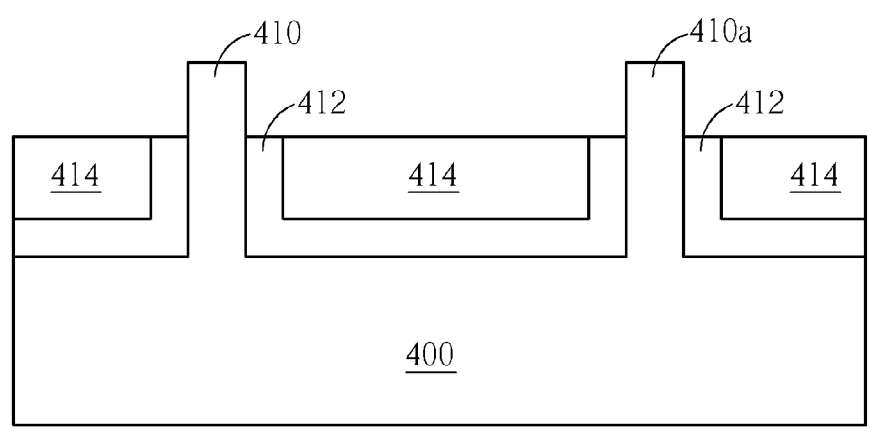
FIG. 12 is a schematic diagram illustrating a structure of the finFET according to the fourth preferred embodiment of the present invention.

In another embodiment of the present invention, a Silicon nitride layer and a silicon oxide layer may be disposed between two fin structures for replacing the STI layer, without forming the STI. As shown in FIG. 12, a substrate 400 is provided, a first fin structure 410 and a second fin structure 410a are disposed on the substrate 400, and sequentially forming a silicon nitride layer 412 and a silicon oxide layer 414 between the first fin structure 410 and the second fin structure 410a for insulating each FinFET devices; the silicon nitride layer 412 and the silicon oxide layer 414 are then etched for adjusting the channel width of the finFET. Other manufacturing processes are similar to the first preferred embodiment detailed above and are not redundantly described here.

To summarize the above descriptions, in the manufacturing method of the finFET of the present invention, an L-shaped insulator is disposed on the STI to adjust the channel width of the finFET. In addition, a plurality of finFETs with different channel width could be formed on one substrate. Furthermore, compared to structures comprising only one stressor, the two stressors devices can provide more stress to the fin structure and therefore enhance the carrier mobility of the finFET.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A finFET device, comprising: a substrate; at least a first fin structure disposed on the substrate; wherein the first fin structure comprises only one material; an L-shaped insulator surrounding the first fin structure and exposing at least partially the sidewalls of the first fin structure, wherein the height of the L-shaped insulator is inferior to the height of the first fin structure in order to expose partially the sidewalls surface of the first fin structure; and a gate structure disposed not only partially on the L-shaped insulator but also partially on the first fin structure.

2. The finFET device of claim 1, wherein the first fin structure and the L-shaped insulator have different etching rate with respective to an etching recipe.

3. The finFET device of claim 1, further comprising a stressor covering the gate structure, the first fin structure and the L-shaped insulator.

4. The finFET device of claim 1, further comprising a STI disposed between the substrate and the L-shaped insulator.

5. The finFET device of claim 1, wherein the L-shaped insulator comprises a multi-layer structure.

6. The finFET device of claim 1, wherein the L-shaped insulator has a tensional or compressive stress.

7. The finFET device of claim 1, wherein the gate structure comprises at least one gate material, wherein the gate material comprises polysilicon or metal, and a high-k dielectric layer disposed between the metal and the substrate.

8. The finFET device of claim 1, wherein the substrate material comprises silicon substrate or SOI (silicon on insulator) substrate.

9. The finFET device of claim 1, further comprising a second fin structure disposed on the substrate, and a second L-shaped insulator at least covering partially the sidewalls of the second fin structure.

10. The finFET device of claim 9, wherein the height of the L-shaped insulator is different from the height of the second L-shaped insulator.

* * * * *